United States Patent [19]

Chien

[11] Patent Number: 5,171,735

[45] Date of Patent: Dec. 15, 1992

[54] METHOD OF FORMING HOLLOW METAL OXIDE SUPERCONDUCTORS (MOS) AND THE LIKE BY POLYMER-METAL-COMPLEX (PMC) TECHNIQUES AND NOVEL HOLLOW MOS STRUCTURES PRODUCED THEREBY

[75] Inventor: James C. W. Chien, Amherst, Mass.

[73] Assignee: Academy of Applied Science, Concord, N.H. ; a part interest

[21] Appl. No.: 438,762

[22] Filed: Nov. 17, 1989

[51] Int. Cl.$^5$ .................. H01L 39/12; B28B 7/30; B29C 33/76
[52] U.S. Cl. .................. 505/1; 264/59; 264/61; 264/313; 264/317; 505/734; 505/737; 505/740
[58] Field of Search .................. 264/65, 313, 317, 59, 264/61; 505/1, 734, 737, 739, 740

[56] References Cited

U.S. PATENT DOCUMENTS 4,810,547  3/1989  Minami et al. .................. 428/65
4,948,763  8/1990  Hayashida et al. .................. 501/95

OTHER PUBLICATIONS

Chien et al., "Polymer Precursor Synthesis and Characterization of YBa$_2$Cu$_3$O$_{7-x}$", *Physical Review B* 1988.

*Primary Examiner*—Jan H. Silbaugh
*Assistant Examiner*—Christopher A. Fiorilla
*Attorney, Agent, or Firm*—Rines and Rines

[57] ABSTRACT

A method for forming a high T$_c$ metal oxide superconductor in the form of a hollow fiber. The method includes the steps of: forming a polymer-metal complex precursor; filling a decomposable hollow fiber mold with the precursor; and heating the filled mold to decompose the mold and convert the precursor to a metal oxide superconductor in the form of a hollow fiber. Ag-doped metal oxide superconductor structures can also be produced by the above method.

13 Claims, 6 Drawing Sheets

METHOD OF FORMING HOLLOW METAL OXIDE SUPERCONDUCTORS (MOS) AND THE LIKE BY POLYMER-METAL-COMPLEX (PMC) TECHNIQUES AND NOVEL HOLLOW MOS STRUCTURES PRODUCED THEREBY

The present invention relates to high $T_c$ metal oxide ceramic superconductors first discovered by Bednorz and Muller, Z. Phys. B64, 189 (1986) that offer promise for revolutionizing techniques for communication, computation, transportation and energy transmission, among other applications; being more particularly directed to methods of synthesizing the same, and improved MOS products produced thereby.

BACKGROUND OF INVENTION

In my copending U.S. patent application Ser. No. 07/266,014, filed Nov. 2, 1988, for Method of Producing Metal Oxide Super-Conducting Polymer Composites Wherein Radiation-Sensitive Resist Polymer-Metal-Complex Precursors Form Interconnected Superconducting Pathways for Integrated Circuit and Similar Applications, and my publications "Polymer Precursor Synthesis of High $T_c$ Superconductors" appearing in Polymer Bulletin 21, 1-4 (1989) and "Polymer Precursor Synthesis and Characterization of $YBa_2Cu_3O_{7-x}$", Physical Review B, Volume 78, No. 6, 1 December 1988, p. 11853-6 relating thereto, a new polymer-metal-complex (PMC) precursor process synthesis of high-$T_c$ superconductors is disclosed, including ceramic oxide superconductors such as $YBa_2Cu_3O_{7-x}$ and the like comprised of crystallites of uniform and extensively interconnected morphology with important advantages over earlier ceramic methods including formation of the desired single phase, uniform grains of controlled sized, low sintering temperatures ($<910°$ C. instead of $>950°$ C.), shorter fabrication time (one hour, for example, instead of days) and free-standing film and solid fiber or filament structures.

In accordance with this process, the PMC is first prepared in which the various metal ions in desired stoichiometric ratio are homogeneously and uniformly complexed to the polymer, with the PMC precursor either cast into a clear film or spun into transparent fibrils. Under nitrogen, the organic polymer is pyrolyzed while the metal compounds react to form intermediate intermetallic compounds which are then converted, in the presence of oxygen, to form the desired high-$T_c$ superconductors.

It has now been discovered that this process can be applied to obtain usable hollow superconducting fibers with the attendant added advantages of the lightness, thinness and the hollowness, and with the potential supplemental and synergistic uses of the inner hollow space, including for conductors, reinforcing structures and for coolant purposes, among others.

OBJECTS OF INVENTION

The preferred object of the invention, accordingly, is to provide a novel method of forming or synthesizing such ceramic and related metal oxide superconductors (MOS) by such PMC precursor techniques while forming the same into hollow fibers or tubes, as well as other shapes or forms.

A further object is to provide novel MOS hollow fiber structures.

Still a further object is to provide improved MOS structures generally.

Other and further objects will be explained hereinafter and are more particularly delineated in the appended claims.

SUMMARY OF INVENTION

In summary, however, from one of its important viewpoints, the invention embraces a method of forming high $T_c$ metal oxide superconductors that comprises preparing an organic polymer-metal complex precursor in which the desired metal ions in desired stoichiometric ratio are homogeneously and uniformly complexed to the polymer to form a polymer-metal-complex precursor solution (P in later-described FIG. 1); filling an organic "mold" hollow fiber F with the precursor solution; thermalyzing the same under $N_2$ ($\Delta$, $N_2$, FIG. 1) to pyrolyze the organic polymer F' while the metal compounds react to form intermediate intermetallic compounds C; and calcining under $O_2$ ($\Delta$, $O_2$) to convert the said intermediate intermetallic compounds C to the desired high-$T_c$ MOS in the form of a hollow fiber.

Preferred and best mode embodiments and novel product formulations achieved by the method of the invention are hereinafter presented.

BRIEF DESCRIPTION OF DRAWINGS

The invention will now be described with reference to the accompanying drawings, FIG. 1 of which, as before described, is an isometric diagram and chart of the method of forming hollow MOS fibers underlying the invention.

DESCRIPTION OF PREFERRED EMBODIMENTS OF INVENTION

Turning, first, to the polymer synthesis, such may involve the poly(methacrylic acid) described in said application and publications, poly(vinyl acetate-comethacrylic acid), poly(itaconic acid-co-methacrylic acid) and polyamic acid, among others.

The multiple metal oxides that may be synthesized with this PMC precursor process include Y-Ba-Cu-O (such as the "1,2,3" compound above discussed—$Y_1$-$Ba_2Cu_3O_x$), Y-Ba-Cu-O with other compositions, Y-Ba-Cu-Ag-O, Bi-Sr-Ca-Cu-O, Pb-Bi-Sr-Ca-Cu-O and similar materials including Au and Tl.

EXAMPLE 1

The polyamic acid type polymer was formed as the PMC precursor based on a polyimide obtained by the condensation of 4.4 g of pyromellitic dianhydride and 3.6 g of diaminodiphenylether in 60 g of dimethyl formamide. To this polymer solution was added 2.5 mmol of $Y(NO_3)_3 5H_2O$, 5 mmol of $Ba(NO_3)_2$ and 7.5 mmol of $Cu(NO_3)_2 2.5 H_2O$.

Figure 1:
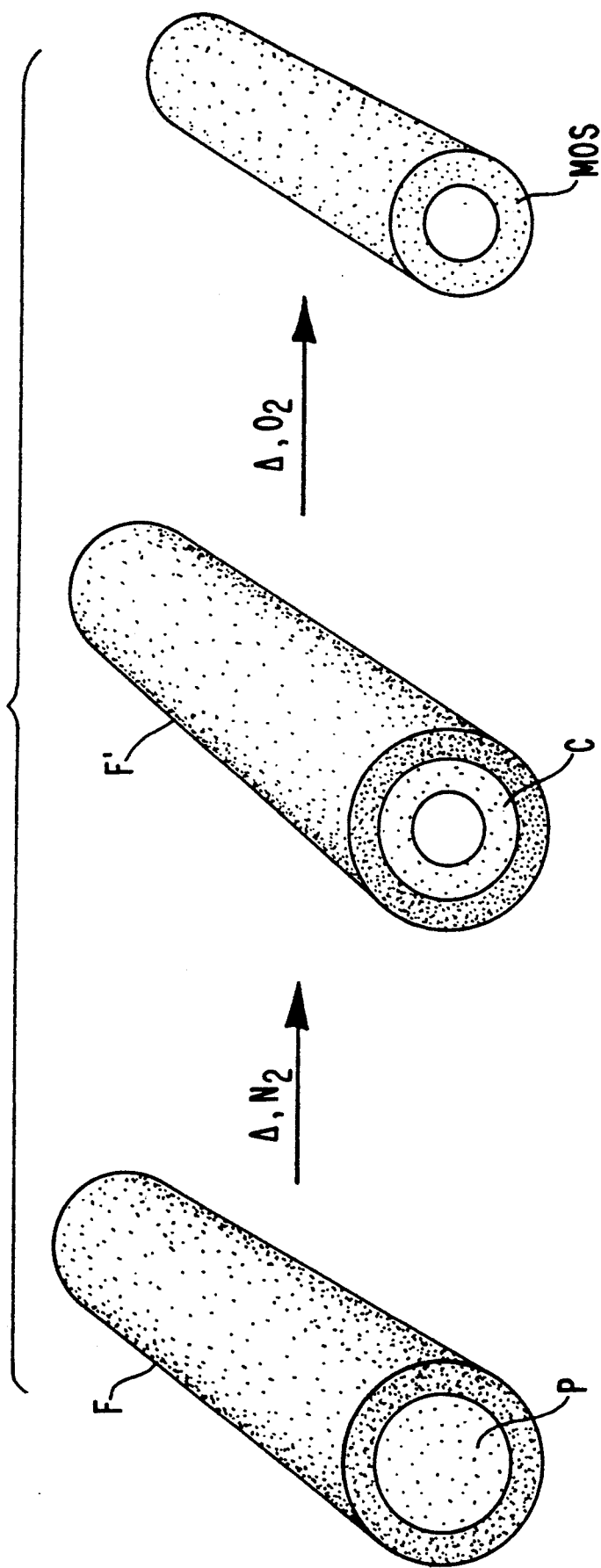
FIGS. 1a and 1b are scanning electron microscope (SEM) photographs of hollow superconducting MOS fibers formed in accordance with the techniques of FIG. 1 underlying the invention.

To fabricate a non-porous hollow "1,2,3" superconducting tube or fiber, use was made of hollow fibers of organic synthetic polymers F, FIG. 1, as the "mold". For instance, polypropylene PILX (dia 330 μm, wall 110 μm), manufactured by Enka AG, Wuppertal, FRG for use as in membrane applications was found useful in the invention. The polypropylene PILX was filled with the said PMC precursor solution P; and then, under 28 psig of $N_2$ pressure, the same was thermolyzed under flow $N_2$ (at 5° C. min$^{-1}$) and held at 160° C. (2 h), 300° C. (2 h), 600° C. (2 h), to pyrolyze and decompose the organic polymer, and with the metal compounds reacting to form intermediate inter-metallic compounds. The resultant was then calcined under flowing $O_2$ (at 300° C. (2 h), 600° C. (2 h), 900–930° C. (2 hr) to convert the intermediate inter-metallic compounds to the desired MOS. This resulted in the "1,2,3" superconductor material in the form of the non-porous hollow MOS fibers or tubes, FIG. 1, of the SEM shown in the photographs of FIGS. 1a and 1b, the PMC precursor naturally gravitating toward the walls of the "mold" as it is concentrated due to solvent evaporation. Subsequent nucleation also occurs on those surfaces.

Figure 1A:
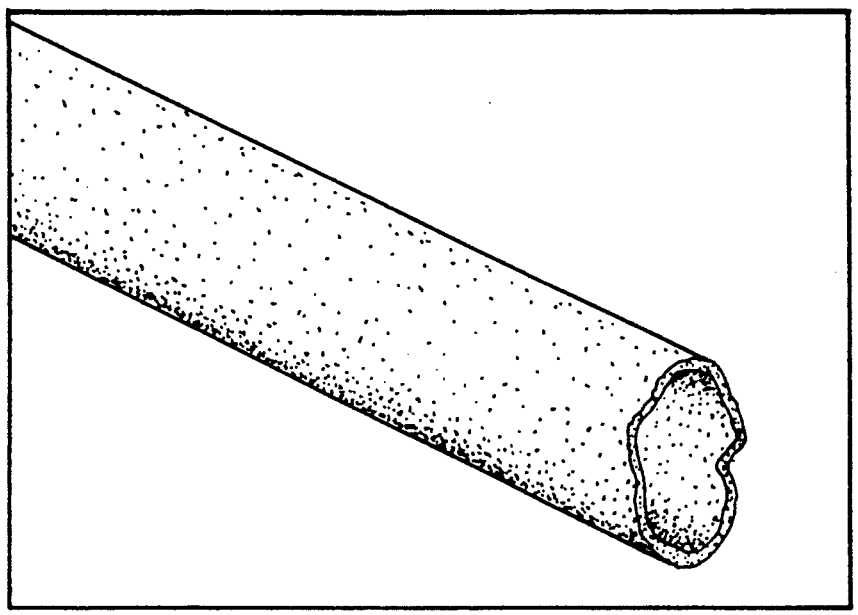
Figure 1B:
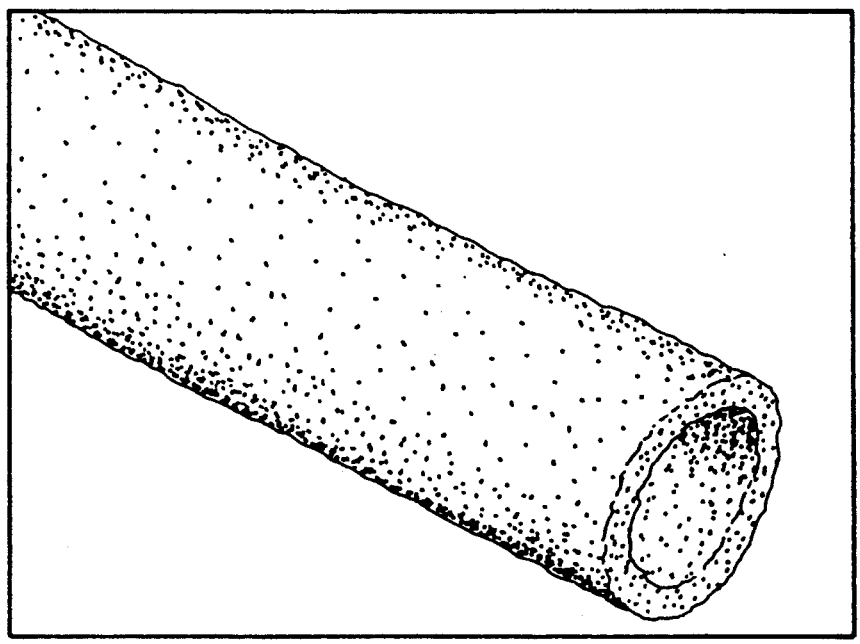
Figure 4:
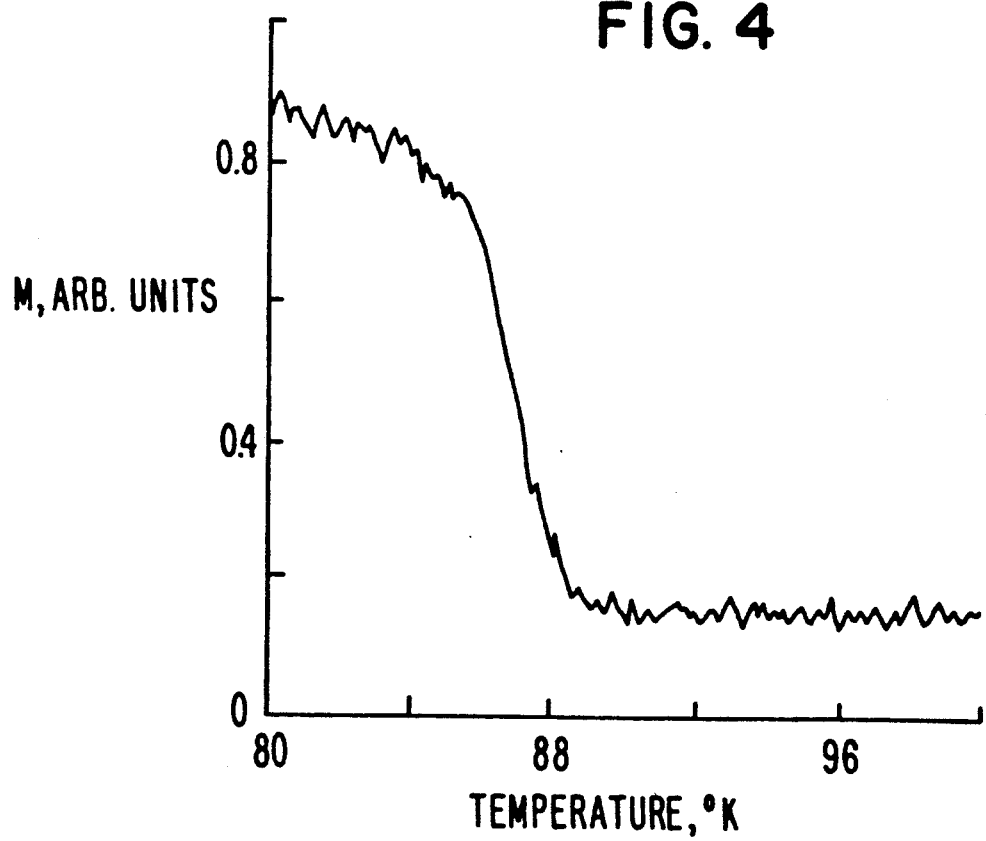
FIG. 4 is an experimentally obtained graph of superconducting measurements.

The non-porous "1,2,3"-hollow fibers of the SEM micrographs of FIGS. 1a and 1b were respectively calcined at 930° C. for 2 h and calcined at 940° C. for 2h. As shown, the higher calcination temperature was found to determine the largest grain-size. AC susceptibility measurements M showed the hollow MOS fibers to exhibit high $T_c$ of narrow width, FIG. 4.

EXAMPLE 2

Figure 2:
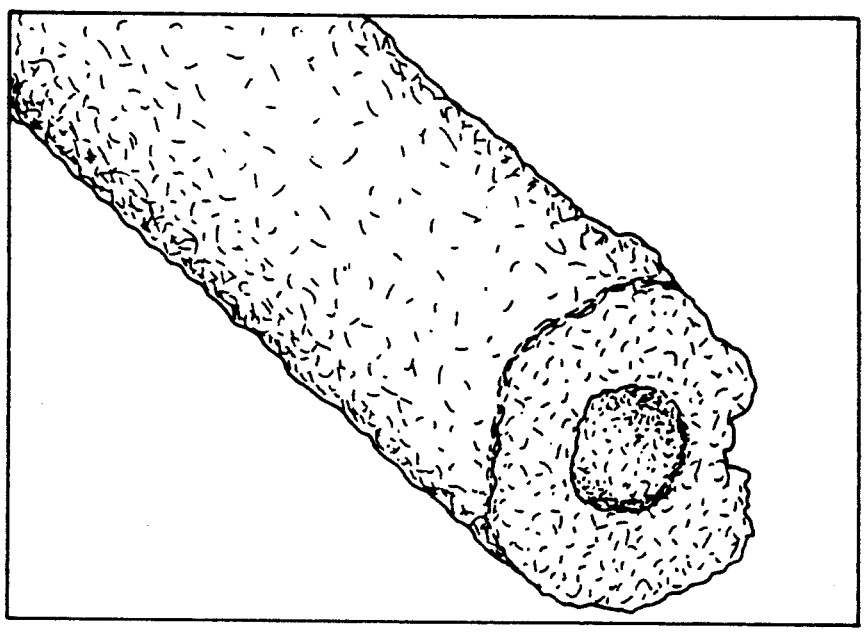
FIG. 2 is a similar SEM of a modification with larger grain size.

When 1g of Ag $NO_3^-$ was combined with the other metal nitrates of Example 1 to form the PMC precursor solution, the resulting "1,2,3"+Ag-hollow fiber had the larger size grains shown in FIG. 2. This Ag-doped "1,2,3" superconductor posseses attractive transport properties including indications of flux pinning behaviors not possessed by Ag-free materials prepared by other procedures. The critical current density is in excess of $2 \times 10^4 Acm^{-2}$ which is more than a hundred times greater than the critical current density of simple 1,2,3" bulk specimens. The SEM micrograph of non-porous "1,2,3"+Ag (33%)-hollow fiber of FIG. 2 was calcined at 920° C. for 2h.

Chemical analysis of such Ag-doping of "1,2,3" structures showed the silver to be present about one-third as Ag° and two-thirds as $Ag_2O$. The presence of doping metals such as the illustrative Ag causes a sharpening of $T_c$ transition, and greatly reduces the normal state resistivity and controls the morphological grain size. The temperature dependence of the latter is close to that for metallic silver. The results suggest that much of the Ag° is present as percolating dispersed phase surrounding an intergrain network of the MOS "1,2,3" grains. Another "1,2,3" MOS Ag-doped sample contained, upon analysis, Y, 8.04%, Ba, 25.06%, Cu, 18.78% and Ag, 31.15% in atomic ratios of 0.92:1.85:3.0:2.93.

Transport measurements indicate that the addition of dopant silver to "1,2,3", using the said PMC-precursor process has profound effects. In addition to increases in strength and critical current density, and a decrease in contact resistance, the Ag-"1,2,3" fiber exhibits some unusual transport properties, in particular, the magnetic field and current dependence appear to be significantly different from previous results on "1,2,3" samples without such dopant silver.

EXAMPLE 3

Figure 3A:
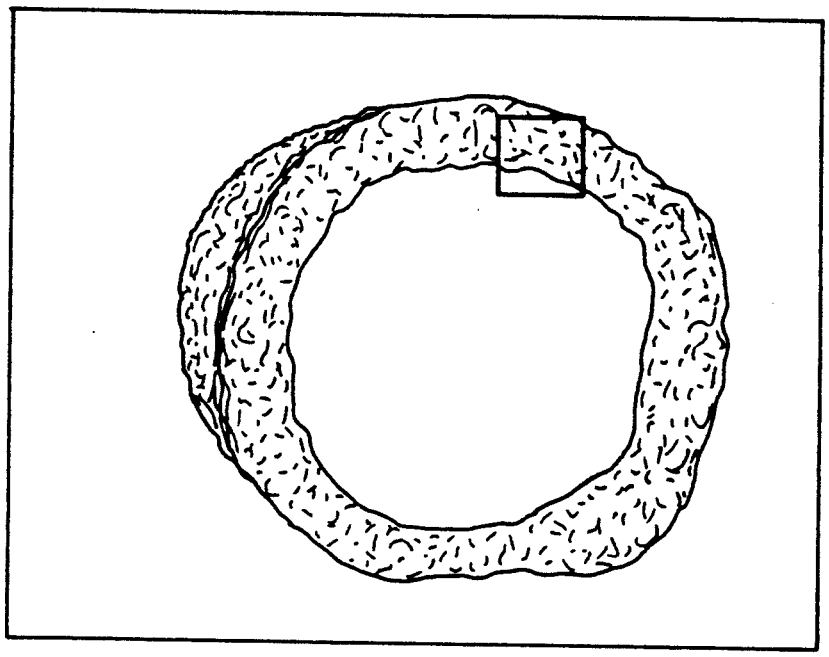
FIG. 3a is a similar SEM of a microporous hollow MOS fiber, with FIGS. 3b and 3c being SEM photographs in larger magnification of sections thereof.
Figure 3B:
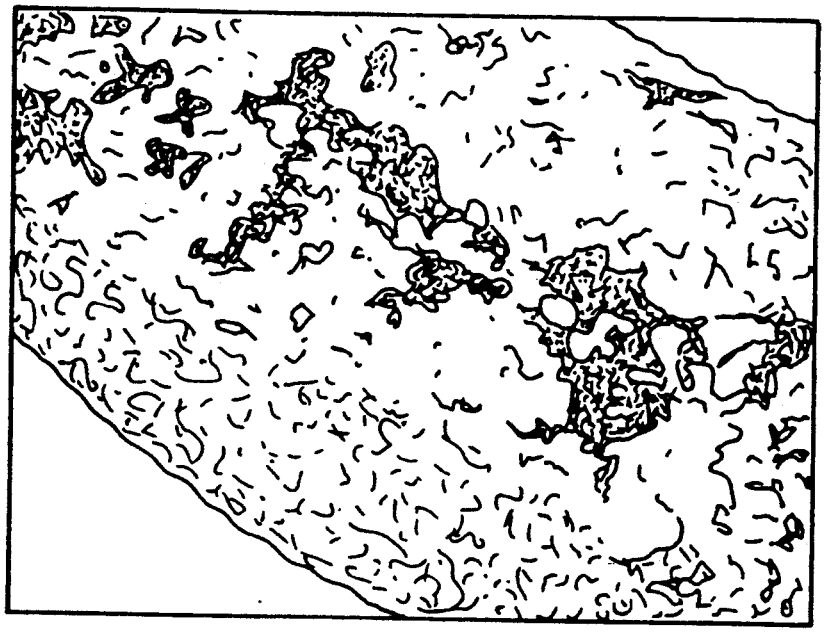
Figure 3C:
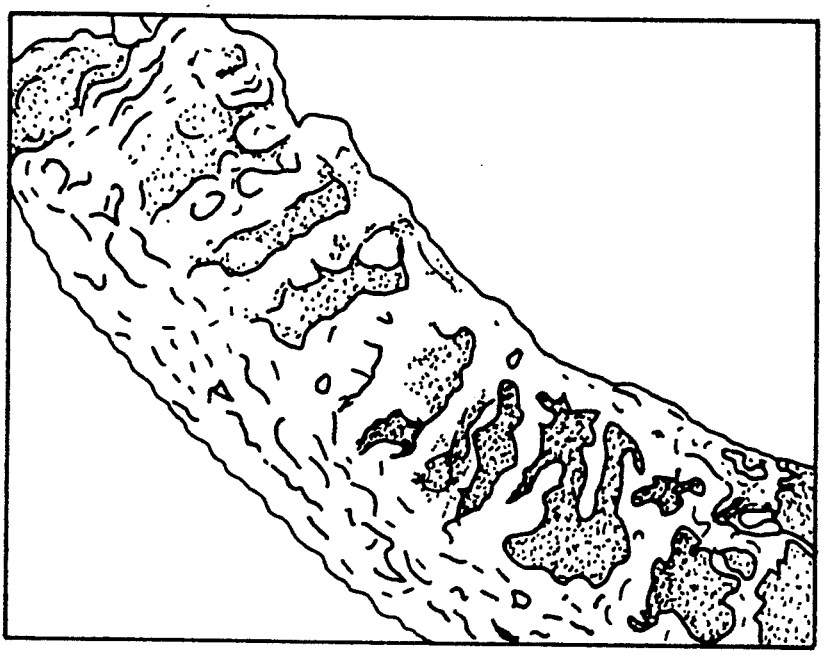

Microporous "1,2,3"-hollow superconducting fibers were also obtained by the steps of Example 1 using polyamide a V386 C hollow fiber. The pores had the same dimensions as those of a porous polyamide V386C tubing, also manufactured by said Enak, and used as the "mold". FIG. 3a is an SEM view into the hollow fiber, with the square section thereof shown magnified in FIG. 3b. The latter clearly illustrates the microstructure as comprised of small interconnected nodules forming a natural percolation network. Another view of the fiber wall, FIG. 3c, shows ladder-like morphology. This interconnective percolating microstructure is an attractive and characteristic feature. In these fabrications of MOS fibers, the PMC precursor solution naturally gravitates towards the walls and/or pores of the "mold" as it is concentrated due to solvent evaporation. Subsequent nucleation also occurs on those surfaces.

EXAMPLES 4, 5 and 6

The process of Example 1, was repeated with each of $Y_5Ba_6Cu_{11}O_x$; $Bi_2Sr_2Ca_2Cu_3O_x$; and $Pb_aBi_bSrCaCu_2O_x$, where a and b are greater than 0.1 and less than 0.9.

As in the case of Example 2, Ag-doping produced the same improvement for the other MOS formulations, above, with Ag and $Ag_2O$ in amounts of 1% to 90% of the combined weight of the other metals in the MOS. Preferably, the Ag and AgO doping is in the 10 to 40 weight percent range.

From experimentation and theoretical considerations, the technique underlying the invention is applicable to all types of ceramic oxide superconductors, representing a generic method of MOS tube or fiber formation. The dimensions of the MOS tube or fiber are broadly variable; the O.D. (outside diameter) corresponding to the diameter of the mold, while the I.D. (inside diameter) is determined by the amounts of the metal constituents in the PMC precursor introduced into the mold.

Figure 5:
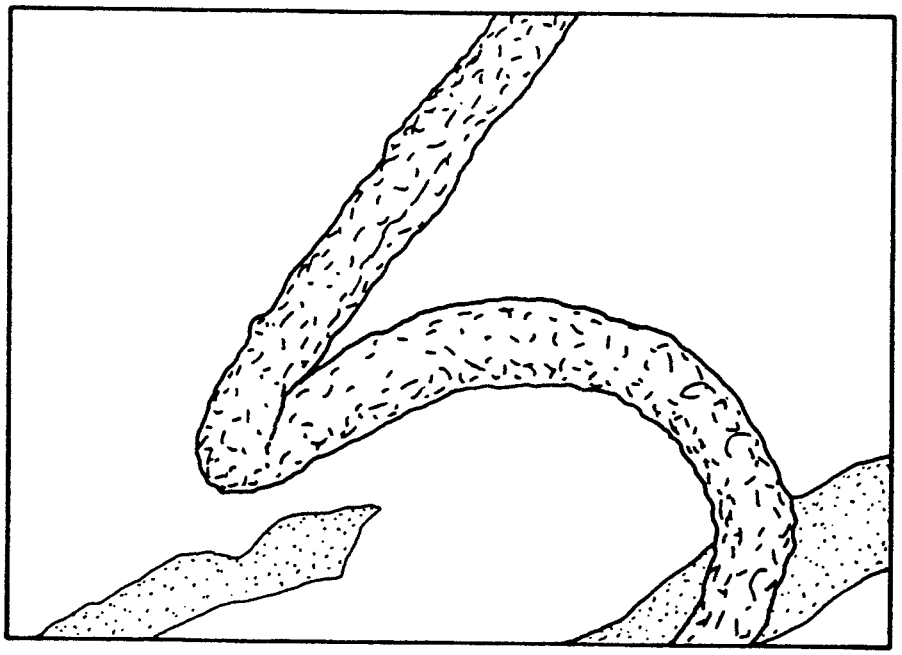
FIG. 5 is an SEM of a solid fiber form.

As described in my said copending application and in said publications, solid "1,2,3"-fibers were readily fabricated by extruding the PMC precursor solution of appropriate viscosity (either of the before-mentioned methyl methacrylate or polyamic acid types, for example) air dried, thermolyzed at 400° C. for 1 h under $N_2$, calcined at 910° C. for 1 h under flowing $O_2$, and cooled to room temperature in 20 min. Superconducting fibers having considerable flexibility have been obtained as shown in FIG. 5. The normal state resistivity decreases linearly with the decrease of temperature. The onset of transition showed excess conductivity consistent for a three-dimensional superconductor, and the transition width was narrower than 1° K. The critical current densities are greater than for bulk specimens by orders of magnitude.

Figure 6:
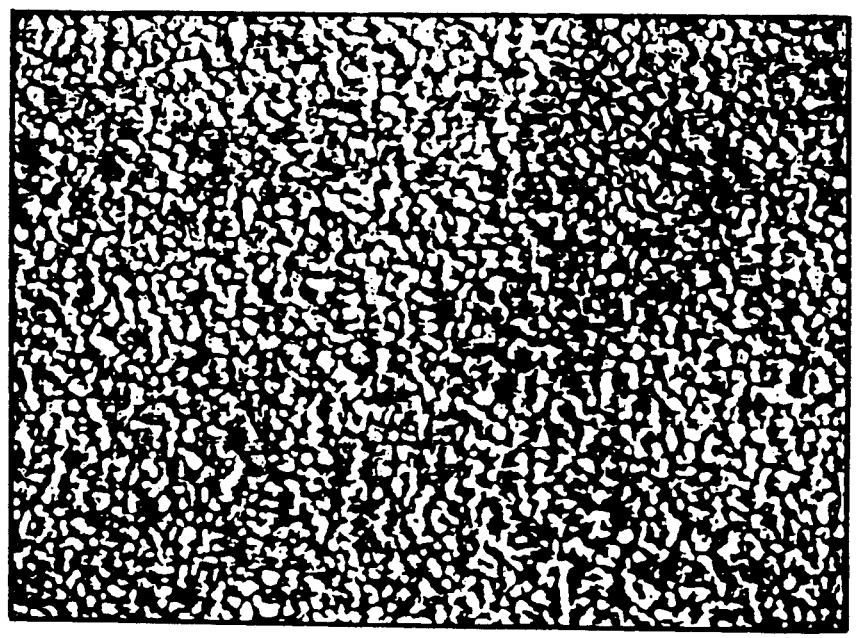
FIG. 6 is an SEM of a thin spun film MOS form.

As also before described and as described in my said copending application and publications, thin "1,2,3"-film has also been prepared by spin-coating the PMC precursor solution on a substrate, being processed in the same way described for the fabrication of the "1,2,3"-solid fiber of FIG. 5. A film of ca. 0.3 μm was readily obtained on single crystal $LaGaO_3$ having interconnective morphology, FIG. 6. X-ray diffraction showed predominantly 001 reflections suggesting ordered microstructures.

Similar films have also been prepared on MgO and $ZrO_2$ (7%$Y_2O_3$) single crystals, and line up on buffered silicon wafers, with or without a thin layer of $SiO_2$; the buffer being any desirable insulating metal oxide, i.e., $LaGaO_3$, $MgO$, $ZrO_2$, $SrTiO_3$, $LaAlO_3$. The metal oxide of 0.1 μm to several μm in the buffered silicon wafer is also formed by the above-described PMC precursor process. Thicker films are obtained by repeated spin coatings and thermolysis before transforming the layers of intermetallic compounds into "1,2,3"-film by calcination.

In conclusion, this PMC precursor synthesis can thus be used for direct synthesis of metal oxide superconductors into hollow or solid fibers and thin oriented films. These materials are of high purity, according to X-ray diffraction and sharp superconducting transition, and they can provide a basis for innovative applications. For instance, latent images can be formed by microlithography and the hollow fibers may be filled with conducting or reinforcing substances.

Further modifications will occur to those skilled in this art and such are considered to fall within the spirit and scope of the invention as defined in the appended claims.

What is claimed is:

1. A method for forming a high $T_c$ metal oxide superconductor in the form of a hollow fiber comprising:
   (a) forming a polymer-metal complex precursor solution by homogeneously and uniformly complexing metal salt ions in desired stoichiometric ratio to a polymer solution;
   (b) filling a hollow fiber mold of organic synthetic polymer with said polymer-metal complex precursor solution;
   (c) thermalyzing the resulting product in $N_2$ whereby the hollow fiber mold is pyrolyzed and decomposed and the polymer-metal complex precursor is converted to intermediate intermetallic compounds; and
   (d) calcining the intermediate intermetallic compounds under $O_2$ to convert said compounds to the desired high $T_c$ metal oxide superconductor in the form of a hollow fiber, the hollow fiber form resulting from gravitation of the precursor toward the mold as the precursor is concentrated.

2. A method as claimed in claim 1 and in which said hollow fiber mold is non-porous such that metal oxide superconductor hollow fiber is non-porous.

3. A method as claimed in claim 1 and in which said hollow fiber mold is porous such that the metal oxide superconductor hollow fiber is porous.

4. A method as claimed in claim 1 and in which the said polymer solution is selected from the group consisting of poly(methacrylic acid), poly(vinyl acetate-comethacrylic acid), poly(itaconic acid-co-methacrylic acid) and polyamic acid and derivatives thereof.

5. A method as claimed in claim 1 and in which the metal oxide and ions are selected from the group consisting of combinations of at least two of Y, Ba, Cu, Ag, Au, Bi, Sr, Ca, Pb, Tl.

6. A method as claimed in claim 4 and in which the said superconducting metal oxide is $YBa_2Cu_3O_x$.

7. A method as claimed in claim 4 and in which the said superconducting metal oxide is $Y_5Ba_6Cu_{11}O_x$.

8. A method as claimed in claim 5 and in which the said superconducting metal oxide is $Bi_2Sr_2Ca_2Cu_3O_x$.

9. A method as claimed in claim 5 and in which the said superconducting metal oxide is $Pb_aBi_bSrCaCu_2O_x$ where a and b are greater than 0.1 and less than 0.9.

10. A method as claimed in claim 5 and in which the said superconducting metal oxides also contain doping metals as of Ag and $Ag_2O$ in amounts of from 1% to 90% of the combined weight of the other metals to control the morphological grain size.

11. A method as claimed in claim 10 and in which the Ag and $Ag_2O$ is present in the 10 to 40 weight percent range.

12. A method as claimed in claim 1 and in which the forming of the hollow fiber about the mold is also effected by nucleation on the mold walls.

13. A method as claimed in claim 1 in which a dopant metal or its oxide is added to the high $T_c$ metal oxide superconductor.

* * * * *